United States Patent
Clemenceau et al.

(10) Patent No.: US 12,525,483 B2
(45) Date of Patent: Jan. 13, 2026

(54) METHOD FOR TRANSFERRING A THIN LAYER ONTO A SUPPORT SUBSTRATE PROVIDED WITH A CHARGE-TRAPPING LAYER

(71) Applicant: Soitec, Bernin (FR)

(72) Inventors: Bruno Clemenceau, Bernin (FR); Ludovic Ecarnot, Bernin (FR); Aymen Ghorbel, Bernin (FR); Marcel Broekaart, Bernin (FR); Daniel Delprat, Bernin (FR); Séverin Rouchier, Bernin (FR); Stephane Thieffry, Bernin (FR); Carine Duret, Bernin (FR)

(73) Assignee: SOITEC, Bernin (FR)

( * ) Notice: Subject to any disclaimer, the term of this patent is extended or adjusted under 35 U.S.C. 154(b) by 420 days.

(21) Appl. No.: 18/007,145

(22) PCT Filed: Jun. 23, 2021

(86) PCT No.: PCT/FR2021/051140
§ 371 (c)(1),
(2) Date: Jan. 27, 2023

(87) PCT Pub. No.: WO2022/023630
PCT Pub. Date: Feb. 3, 2022

(65) Prior Publication Data
US 2023/0230874 A1 Jul. 20, 2023

(30) Foreign Application Priority Data

Jul. 28, 2020 (FR) ....................................... 2007952
Mar. 30, 2021 (FR) ....................................... 2103274

(51) Int. Cl.
*H01L 21/762* (2006.01)
*H01L 21/02* (2006.01)
*H01L 21/683* (2006.01)

(52) U.S. Cl.
CPC .. *H01L 21/76254* (2013.01); *H01L 21/02274* (2013.01); *H01L 21/6835* (2013.01)

(58) Field of Classification Search
None
See application file for complete search history.

(56) References Cited

U.S. PATENT DOCUMENTS 5,728,631 A * 3/1998 Wang .................. H01L 21/7682
438/787
6,544,656 B1 4/2003 Abe et al.
(Continued)

FOREIGN PATENT DOCUMENTS

FR 2860341 B1 12/2005
FR 2933233 A1 11/2010
(Continued)

OTHER PUBLICATIONS

French Search Report for Application No. 2007952 dated Apr. 13, 2021, 2 pages.
(Continued)

*Primary Examiner* — Asok K Sarkar
(74) *Attorney, Agent, or Firm* — TraskBritt

(57) ABSTRACT

A method for transferring a thin layer onto a carrier substrate comprises preparing a carrier substrate using a preparation method involving supplying a base substrate having, on a main face, a charge-trapping layer and forming a dielectric layer having a thickness greater than 200 nm on the charge-trapping layer. Once the dielectric layer is formed, the ionized deposition and sputtering of the dielectric layer are simultaneously performed. The transfer method also com-
(Continued)

prises assembling, by way of molecular adhesion and with an unpolished free face of the dielectric layer, a donor substrate to the dielectric layer of the carrier substrate, the donor substrate having an embrittlement plane defining the thin layer. Finally, the method comprises splitting the donor substrate at the embrittlement plane to release the thin layer and to transfer it onto the carrier substrate.

20 Claims, 3 Drawing Sheets

(56) References Cited

U.S. PATENT DOCUMENTS

| | | | |
|---|---|---|---|
| 6,756,285 B1 * | 6/2004 | Moriceau | H01L 21/185 438/455 |
| 7,268,060 B2 | 9/2007 | Ghyselen et al. | |
| 2010/0187649 A1 | 7/2010 | Allibert et al. | |
| 2010/0216294 A1 | 8/2010 | Rabarot et al. | |
| 2015/0115480 A1 | 4/2015 | Peidous et al. | |
| 2017/0200648 A1 | 7/2017 | Lee et al. | |
| 2017/0221839 A1 | 8/2017 | Kononchuk et al. | |
| 2019/0035881 A1 | 1/2019 | Kweskin | |
| 2020/0020520 A1 | 1/2020 | Reynaud et al. | |

FOREIGN PATENT DOCUMENTS

| | | |
|---|---|---|
| FR | 2953640 B1 | 2/2012 |
| JP | 2002-134488 A | 5/2002 |
| JP | 2007-095951 A | 4/2007 |
| JP | 2010-515254 A | 5/2010 |
| JP | 2011-503839 A | 1/2011 |
| JP | 2017-532758 A | 11/2017 |
| JP | 2017-220503 A | 12/2017 |
| JP | 2019-513294 A | 5/2019 |
| JP | 2020-505769 A | 2/2020 |
| TW | 1687969 B | 3/2020 |
| WO | 2020/008116 A1 | 1/2020 |
| WO | 2022/023630 A1 | 2/2022 |

OTHER PUBLICATIONS

French Written Opinion for Application No. 2007952 dated Apr. 13, 2021, 5 pages.

International Search Report for International Application No. PCT/FR2021/051140 dated Oct. 7, 2021, 3 pages.

International Written Opinion for International Application No. PCT/FR2021/051140 dated Oct. 7, 2021, 5 pages.

Machida et al., New planarization technology using bias ECR plasma deposition by Machida et al., 17th Conference on Solid State Devices and Materials, Japanese Journal of Applied Physics, pp. 329-332 (1985).

Pye et al., High-Density Plasma CVD and CMP for 0.25-micrometer Intermetal Dielectric Processing, http://www.electroiq.com/index/Semiconductors/sst-current-issue.html, (Dec. 1995), 4 pages.

Taiwanese Office Action for Application No. 110126926 dated Jun. 21, 2022, 3 pages.

Japanese Office Action and Search Report for Application No. 2023-501665 dated Jan. 20, 2024, 28 pages with English translation.

Japanese Final Rejection for Application No. 2023-501665 dated Jun. 12, 2025, 5 pages with English translation.

* cited by examiner ized Mon Mar 30, 2021.

METHOD FOR TRANSFERRING A THIN LAYER ONTO A SUPPORT SUBSTRATE PROVIDED WITH A CHARGE-TRAPPING LAYER

CROSS-REFERENCE TO RELATED APPLICATIONS

This application is a national phase entry under 35 U.S.C. § 371 of International Patent Application PCT/FR2021/051140, filed Jun. 23, 2021, designating the United States of America and published as International Patent Publication WO 2022/023630 A1 on Feb. 3, 2022, which claims the benefit under Article 8 of the Patent Cooperation Treaty to French Patent Application Serial Nos. FR2007952 filed Jul. 28, 2020 and FR2103274 filed Mar. 30, 2021.

TECHNICAL FIELD

The present disclosure relates to a process for transferring a thin layer to a carrier substrate comprising a charge-trapping layer. These substrates are applicable, in particular, in the field of radiofrequency integrated devices, i.e., electronic devices that handle signals in the frequency range between about 3 kHz and 300 GHz, for example, in the field of telecommunications (telephony, Wi-Fi, Bluetooth, etc.). These substrates are also applicable in the field of photonics.

BACKGROUND

To prevent or limit the effect of electromagnetic coupling that may occur between an electronic or photonic device and the carrier substrate of a silicon-on-insulator (SOI) substrate on which this device is formed, it is known practice to insert, between the buried dielectric layer and the carrier of the SOI, directly beneath the dielectric layer, a charge-trapping layer. This layer may consist, for example, of a layer of 1 to 10 microns of polycrystalline silicon. The boundaries of the grains forming the polycrystalline material then form traps for the charge carriers, the trapped charge carriers possibly originating from the trapping layer itself or from the subjacent substrate. Thus, the formation of a conductive plane under the insulating layer is prevented. The production of this type of SOI substrate is, for example, described in documents FR2860341, FR2933233, FR2953640, US2015115480, U.S. Pat. Nos. 7,268,060, 6,544,656, US20200020520 or To form an SOI substrate featuring such a trapping layer, a carrier substrate is prepared by forming a charge-trapping layer on a base substrate. Next, a thin layer is transferred to this carrier substrate using a layer transfer process, for example, using SMART CUT® technology. According to this technology, a donor substrate is joined to the carrier substrate, typically by molecular bonding, the donor substrate featuring a weakened plane defining, with its exposed face, the thin layer to be transferred. The donor substrate is then split at the weakened plane so as to transfer the thin layer to the carrier substrate. The dielectric layer is inserted between the carrier substrate and the thin layer, for example, by oxidizing either or both of these substrates, before joining them.

With SMART CUT® technology, the weakened plane is obtained by introducing light species (hydrogen and/or helium, for example) into the donor substrate, through the dielectric layer when present, generally by implantation. The thickness of the thin layer to be transferred dictates the energy and dose of the species to be implanted: the greater the thickness, the greater the energy and dose. Implanting a large dose at high energy is not industrially favorable; thus, to get around this problem, it is preferable to form a portion at least of the dielectric layer on the carrier substrate rather than on the donor substrate, in particular, when this dielectric layer is chosen so as to be relatively thick, for example, thicker than 200 nm. In the field of photonics, this thickness may reach one micron, or even several microns, which exacerbates all of the problems related to the presence of a dielectric layer of substantial thickness.

Experiments performed by the applicant have thus revealed that the formation of a dielectric layer by oxidizing a charge-trapping layer made of polycrystalline silicon presents a number of problems. This oxidation tends to form a carrier substrate that exhibits a rough surface state, which must therefore be prepared before the joining step, for example, by polishing, thereby making the process more complex. The buried interface between the silicon oxide and the rest of the polysilicon layer is also rough, which may present problems when optically inspecting the SOI substrate during the device production steps. It should be noted in this regard that this interface is not accessible for polishing, and is necessarily kept within the body of the substrate, which may negatively affect the operation of a device formed in/on a substrate employing such a carrier substrate, in particular, a photonic device. In addition, the oxidation step tends to deform the carrier substrate and result in substantial bowing. The presence of such bowing complicates the subsequent joining step, and more generally the handling of the carrier substrate on the production line using conventional equipment.

It should be noted that forming the dielectric layer by deposition on the carrier substrate instead of by oxidizing the carrier presents similar problems. Specifically, the conventional techniques of PECVD (plasma-enhanced chemical vapor deposition) or LPCVD (low-pressure chemical vapor deposition) cause substantial bowing and generally result in the formation of very rough layers that have to be prepared by polishing before any joining may be considered.

The documents "High density plasma CVD and CMP for 0.25 M intermetal dielectric processing" by Pye et al., Solid State Technology, Penwell Corporation, vol. 38, no. 12, 1995; and "New planarization technology using bias ECR plasma deposition" by Machida et al., Japanese Journal of Applied Physics, pages 329-332 (1985), teach techniques for depositing intermetal dielectric films that are generally located between two levels of metals of a functional semiconductor structure. These films aim to fill in topographical patterns that exhibit a substantial aspect ratio, and the deposition thereof is followed by a polishing step.

BRIEF SUMMARY

With a view to achieving one of these aims, the subject of the present disclosure relates to a process for transferring a thin layer to a carrier substrate, comprising the following steps:
  preparing a carrier substrate using a preparation process comprising the provision of a base substrate that has, on a main face, a charge-trapping layer and the formation of a dielectric layer having a thickness greater than 200 nm on the charge-trapping layer, the formation of the dielectric layer simultaneously implementing the deposition and the ion sputtering of the dielectric layer;
  joining, by means of molecular bonding and without preparing the free face of the dielectric layer by polishing, a donor substrate to the dielectric layer of the carrier substrate, the donor substrate featuring a weakened plane defining the thin layer; and splitting the donor substrate at the weakened plane so as to release the thin layer and transfer it to the carrier substrate.

According to other advantageous and non-limiting features of the disclosure, taken alone or in any technically feasible combination:

- the preparation process comprises the formation of a bow compensation layer on a back face of the base substrate, opposite the main face;
- the bow compensation layer has a thickness of between 500 nm and 1000 nm;
- the base substrate is a monocrystalline silicon substrate exhibiting a resistivity lower than 1000 ohm·cm;
- the base substrate is a monocrystalline silicon substrate exhibiting a resistivity higher than 600 ohm·cm;
- the charge-trapping layer comprises polycrystalline silicon;
- the charge-trapping layer comprises carbon;
- the charge-trapping layer has a thickness of between 1 micron and 20 microns;
- the dielectric layer consists of silicon oxide;
- the dielectric layer comprises a barrier layer made of silicon nitride or of silicon oxynitride;
- the dielectric layer has a thickness of between 200 nm and 10 microns, and preferably between 600 nm and 10 microns;
- the deposition/sputtering ratio is between 1 and 10, preferably between 2 and 5;
- the dielectric layer is formed at a temperature of between 300° C. and 450° C., preferably between 350° C. and 400° C.;
- the dielectric layer is formed in an atmosphere exhibiting a pressure lower than atmospheric pressure;
- the process further comprises an operation of annealing the dielectric layer in a neutral atmosphere and at a temperature exceeding the temperature of formation of the dielectric layer, preferably lower than 950° C.;
- the free face of the dielectric layer exhibits a roughness lower than 0.5 nm in terms of RMS value over a field of measurement of 10 microns by 10 microns; and
- the donor substrate is devoid of any dielectric surface layer.

BRIEF DESCRIPTION OF THE DRAWINGS

Other features and advantages of the disclosure will become apparent from the following detailed description, with reference to the accompanying figures, in which.

DETAILED DESCRIPTION

Presentation of the Final Substrate

Figure 2:
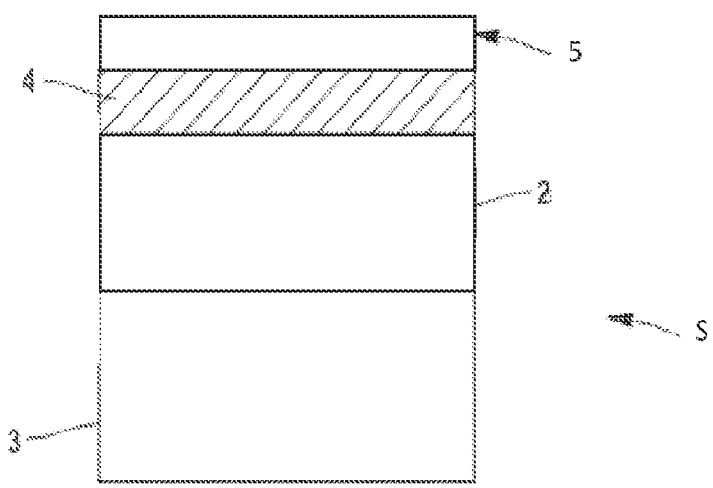
FIG. 2 shows a final substrate obtained on completion of a layer transfer process according to the disclosure.

With reference to FIG. 2, a final substrate S of one embodiment comprises a base substrate 3, a charge-trapping layer 2 arranged on the base substrate 3, a dielectric layer 4 arranged on and directly in contact with the charge-trapping layer 2 and a thin layer 5 arranged on the dielectric layer 4.

The base substrate 3 provided with the charge-trapping layer and with the dielectric layer 4 forms a carrier substrate 1 of the final substrate S.

Figure 4:
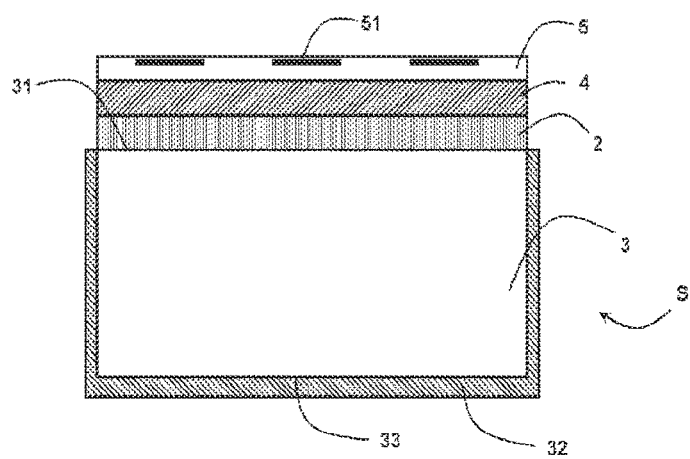
FIG. 4 shows a final substrate obtained on completion of a layer transfer process of one embodiment.

In the embodiment illustrated in FIG. 4, the carrier substrate 1 of the final substrate S comprises a base substrate 3 provided with a charge-trapping layer 2 and with a bow compensation layer 32. The function of this layer is to cause a deformation of the base substrate 3, the purpose of which is, in particular, to at least partially compensate for the future deformations that the base substrate 3 and the final substrate S will undergo during the various steps of the process that forms the main subject of this description. In particular, this means compensating for the stresses applied by the dielectric layer 4 and, to a lesser degree, by the charge-trapping layer 2 when they are formed on the base substrate 3.

The charge-trapping layer 2 is arranged on a main face 31 of the base substrate 3, and the bow compensation layer 32 is arranged on a back face 33 of the base substrate 3, this back face 33 being opposite the main face 31. Preferably, the bow compensation layer 32 is made of silicon oxide or of silicon nitride. It has a thickness greater than 200 nm, and more preferably a thickness of between 500 and 1000 nm.

The final substrate S (and therefore the carrier substrate 1) of the embodiments of FIGS. 2 and 4 may take the form of a circular wafer of standardized size, for example, 200 mm or 300 mm, or even 450 mm in diameter. This is the case, in particular, when the final substrate S, and, in particular, the thin layer 5, is still devoid of any devices. However, the disclosure is not in any way limited to these dimensions or to this form.

The base substrate 3 has a thickness of several hundreds of microns. Preferably, the base substrate 3 exhibits a high resistivity, higher than 100 or 1000 ohm·cm, and more preferably still higher than 3000 ohm·cm. In this way, the density of charges, i.e., holes or electrons, which are liable to move in the base substrate 3 and therefore degrade the RF performance of the final substrate S, is limited. However, the disclosure is not limited to a base substrate 3 exhibiting such resistivity, and it also provides advantages in RF performance when the base substrate 3 exhibits a more typical resistivity, lower than 1000 ohm·cm, on the order of a few hundred ohm·cm, or 100 ohm·cm or less.

For reasons of availability and cost, the base substrate 3 is preferably made of silicon, and, in particular, of monocrystalline silicon. It may, for example, be a CZ substrate containing a small amount of interstitial oxygen, this type of substrate, as is well known per se, having a resistivity that may be higher than 1000 ohm·cm. The base substrate 3 may alternatively be formed from another material: it may, for example, be made of sapphire, of silicon carbide, of silicon-germanium, of III-V materials, of glass, etc. It may alternatively be a more standard CZ monocrystalline substrate, the resistivity of which is lower than 1000 ohm·cm, or else a CZ substrate containing a high or medium amount of interstitial oxygen, which may be n- or p-doped and which has a resistivity that may be on the order of 500 ohm·cm or less.

The carrier substrate 1 of the various embodiments of the present disclosure may optionally comprise, arranged on, and directly in contact with, the base substrate 3, a dielectric thin layer, for example, made of silicon dioxide or of silicon nitride. The dielectric thin layer (not shown in FIGS. 1 and 2) has a thickness greater than a few nanometers, for example, between 5 nm and 500 nm. It may be obtained by oxidation of the base substrate 3 or by deposition on this substrate. In order to limit the time and cost required to form this thin layer, its thickness may be chosen so that it is between 5 nm and 200 nm, such as, for example, 145 nm.

The dielectric thin layer makes it possible to prevent or limit recrystallization of the charge-trapping layer 2 when the carrier substrate 1 or the final substrate S is exposed to a high temperature.

The carrier substrate 1 also comprises a charge-trapping layer 2, arranged on and directly in contact with the base substrate 3 (or with the dielectric thin layer when present). The trapping layer 2 has a resistivity higher than 500 ohm·cm and preferably than 1000 ohm·cm, and even more preferably higher than 10 kohm·cm. As mentioned above in the introduction of the present application, the function of the trapping layer is to trap any charge carriers present in the carrier substrate 1 and to limit their mobility. This is especially the case when the final substrate S comprises a semiconductor structure that emits an electromagnetic field that penetrates into the carrier substrate 1 and that is therefore liable to interact with these charges and to make them mobile. The charge-trapping layer 2 has a thickness that is typically between 1 micron and 15 microns, or even 20 microns.

The charge-trapping layer 2 may, in general, be formed from a non-monocrystalline semiconductor layer having structural defects such as dislocations, grain boundaries, amorphous zones, interstices, inclusions, pores, etc. These structural defects form traps for any charges flowing through the material, for example, at the site of incomplete or dangling chemical bonds. Conduction is thus prevented in the trapping layer, which consequently exhibits high resistivity.

For the same reasons of availability and cost that were mentioned above, the charge-trapping layer 2 is preferably made of polycrystalline silicon. However, it may be formed from or comprise another polycrystalline semiconductor material. Of course, this charge-trapping layer 2 may be formed by means of a technique other than that involving a layer formed of polycrystalline silicon. This layer may also comprise carbon or consist of or comprise silicon carbide or an alloy of silicon and carbon, for example, in the form of interlayers inserted into a thickness of polycrystalline silicon. When the charge-trapping layer 2 consists of silicon carbide or an alloy of silicon and carbon, its thickness is preferably between a few nanometers (for example, 2 nm) and a few tens of nanometers (for example, 50 nm). Alternatively, the electric traps may be formed in the charge-trapping layer 2 by means of ion bombardment with relatively heavy species (for example, argon) in a surface portion of the base substrate 3 in order to create crystal defects therein that are able to trap electric charges. It is also possible to envisage a charge-trapping layer 2 formed of a porous material, for example, by porosifying a surface portion of the base substrate 3 when it is made of silicon.

In any case, the charge-trapping layer 2 exhibits a high resistivity higher than 500 ohm·cm. To that end, the charge-trapping layer 2 is not intentionally doped, i.e., it has a charge carrier dopant concentration lower than 10 E14 atoms per cubic centimeter. It may be rich in nitrogen or in carbon in order to improve its resistivity characteristic.

Figure 1:
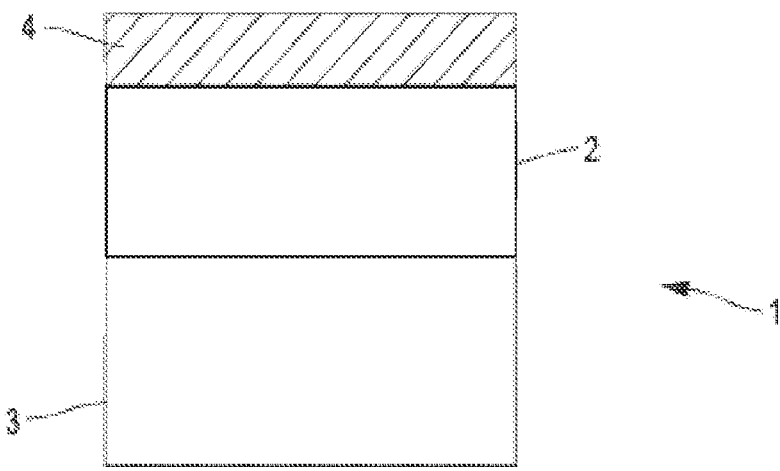
FIG. 1 shows a carrier substrate of a layer transfer process according to the present disclosure.

Returning to the general description of FIGS. 1 and 4, the carrier substrate 1 also comprises a dielectric layer 4 directly arranged on the charge-trapping layer 2. By way of example, the dielectric layer 4 may consist of or comprise silicon dioxide or silicon nitride. It may also be a stack of these materials. The thickness of the dielectric layer 4 may be between 10 nm and 10 microns, but in the context of the present description, this layer has a relatively substantial thickness, for example, greater than 200 nm, and preferably between 200 nm and 10 microns, or between 200 nm and 1 micron. This is especially the case when the final substrate targets applications in the field of photonics, which requires a thick dielectric layer 4, the thickness of which is typically greater than 600 nm and may even reach 10 microns.

The final substrate S comprises a thin layer 5, on and in contact with the dielectric layer 4 of the carrier substrate 1. The thin layer is usually made of monocrystalline silicon, but it could comprise any other material, whether semiconductor or otherwise, depending on the nature of the device intended to be formed thereon or therein. When the final substrate S is intended to receive semiconductor integrated components, the thin layer 5 may thus be composed of monocrystalline silicon, or of any other semiconductor material such as germanium, silicon-germanium, or silicon carbide.

The semiconductor integrated components may, in particular, be of a photonic nature, e.g., passive or active components such as waveguides, ring resonators or Mach-Zehnder interferometers. Devices of this type, in particular, optical phase-shifters and switches, must be able to efficiently convey a large quantity of signals while observing specifications in terms of compactness, low power consumption, limiting electromagnetic coupling effects, and switching speed, which may advantageously be provided by advanced substrates such as the final substrate S.

Advantageously, the photonic device 51 (shown by way of illustration in FIG. 4) forms a switch, a waveguide, a phase-shifter, a modulator, a laser emitter, an amplifier, a directional coupler, a filter, and/or a multiplexer.

When the final substrate S is intended to receive surface-acoustic-wave filters, the thin layer 5 may be composed of a piezoelectric and/or ferroelectric material, such as lithium tantalate or lithium niobate. The thin layer 5 may also comprise finished or semi-finished integrated components, formed on a donor substrate and transferred to the carrier substrate 1 during the production of the final substrate S. In general, the thin layer 5 may have a thickness of between 10 nm and 10 microns.

Preparation of the Carrier Substrate

A process for preparing the carrier substrate 1 shown in FIG. 1 is now presented. In a first step, the base substrate 3 is provided, which exhibits, on a main face, the charge-trapping layer 2. This charge-trapping layer 2, when it is made of polycrystalline silicon, may be produced using industry-standard deposition equipment. It may thus involve RPCVD (remote plasma-enhanced chemical vapor deposition) or PECVD (plasma-enhanced chemical vapor deposition). It may also involve LPCVD (low-pressure chemical vapor deposition). However, as seen above, the formation of the trapping layer on or in the base substrate 3 may be achieved in many other ways, for example, by implanting heavy species or by porosifying a surface layer of the base substrate 3.

Optionally, a dielectric thin layer may have been formed on the base substrate 3, for example, by oxidation or deposition of a thickness of oxide, before forming the charge-trapping layer 2 thereon.

Figure 3A:
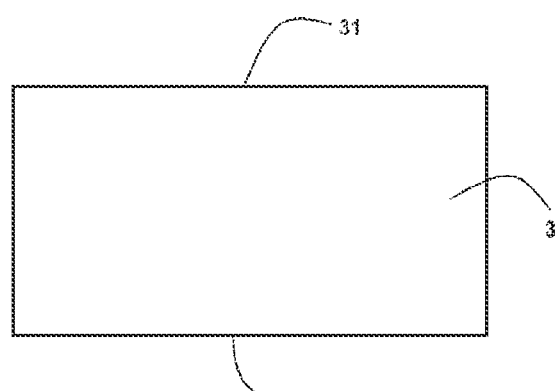
FIGS. 3A to 3E show one embodiment of a carrier substrate.
Figure 3B:
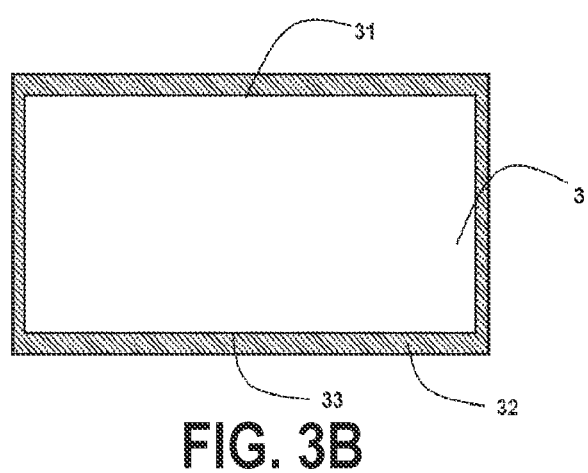

In the case of the embodiment providing a bow compensation layer, this first step comprises, before the formation of the trapping layer, a subsequent first substep for forming a compensation layer on all of the exposed surfaces of the base substrate (FIGS. 3A and 3B). For the same reasons of availability and cost as mentioned above, the bow compensation layer 32 may be made of silicon oxide formed by thermally oxidizing the silicon base substrate 3, for example, at a temperature of between 800 and 1100° C.

Figure 3C:
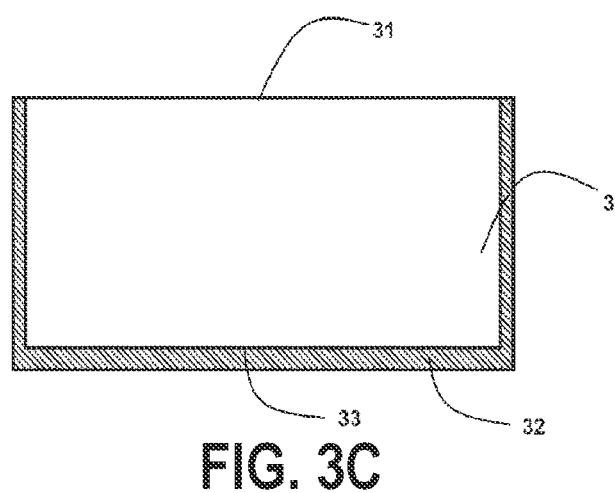

In a subsequent substep shown in FIG. 3C, the bow compensation layer 32 is at least partly removed from the front face 31, before forming the charge-trapping layer 2 and the dielectric layer 4. This substep may, in particular, be performed by polishing the front face 31. It is possible to envisage retaining a portion of the bow compensation layer 32 on the front face 31 of the base substrate in order to constitute the dielectric thin layer on which the charge-trapping layer will be formed.

The stresses present in the bow compensation layer 32 are balanced when this layer is present on each of the main 31 and back 33 faces of the base substrate 3. The substep of removing the bow compensation layer 32 from the main face 31 while retaining the bow compensation layer 32 at least on the back face 33 results in this balance being upset and in the base substrate 3 bowing. Thus, when the bow compensation layer 32 is compressively strained, the base substrate 3 will exhibit negative curvature conferring a slightly concave shape thereon.

Thus, by way of example, when the base substrate 3 is made of silicon and has a conventional thickness on the order of 650 microns, keeping a bow compensation layer 32 made of thermal silicon oxide solely on the back face 33 with a thickness of about 600 nm will generate a concave curvature on the order of −110 μm. This concave curvature will make it possible to at least partly compensate for the deformation caused by the trapping layer and the dielectric layer.

The thickness of the bow compensation layer 32 is thus determined according to the target thicknesses of the charge-trapping layer 2 and of the dielectric layer 4 so that the carrier substrate exhibits a predetermined tolerated curvature after the formation of these layers. This tolerated curvature may be at most 100 microns (and preferably at most 60 microns or 40 microns) for a substrate with a diameter of 300 mm, this maximum value allowing the carrier substrate to be handled and processed using conventional equipment. The thickness of the bow compensation layer 32 is typically between 500 nm and 1000 nm.

Figure 3D:
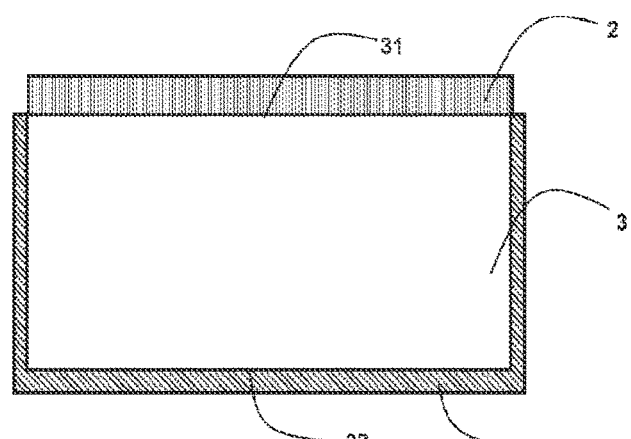
Figure 3E:
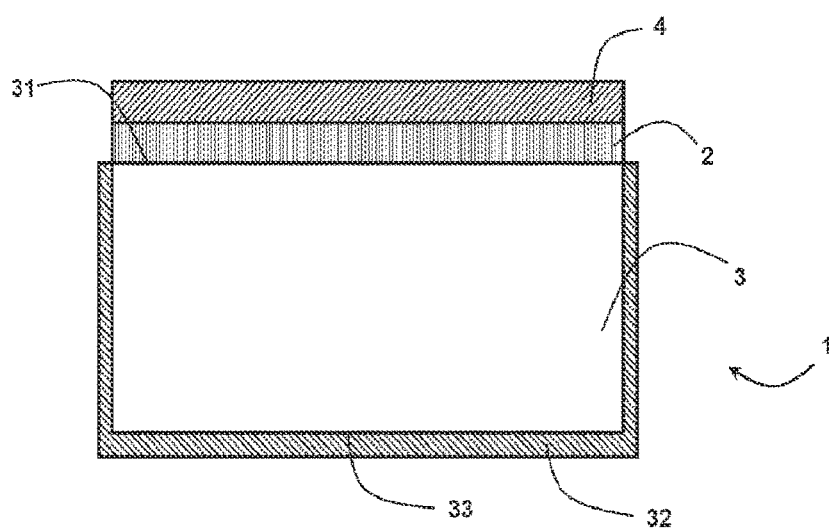

FIG. 3D shows the carrier substrate of this embodiment on completion of this first step, i.e., after the formation of the charge-trapping layer 2.

In a second step of the process for preparing the carrier substrate 1, and regardless of whether or not the base substrate is provided with a compensation layer, the dielectric layer 4 is formed on the charge-trapping layer 2. According to one important aspect of the process, the formation of the dielectric layer 4 simultaneously implements the deposition and the ion sputtering of this dielectric layer 4.

Such a technique for forming the dielectric layer may be performed by placing the base substrate 3 provided with the charge-trapping layer 2 and potentially with the bow compensation layer 32 in a chamber of an HDP CVD (high-density plasma chemical vapor deposition) apparatus.

Such a chamber is provided with a plasma source arranged in an upper portion of the chamber, which is excited by an RF source (for example, having a frequency of about 13 MHz) in order to form therein a plasma from which electrons and ions present at very high density (on the order of $10^{10}$ to $10^{12}$ per $cm^3$) may be extracted. The substrate introduced into the chamber is arranged on a carrier, which forms a second electrode connected to a second RF source (for example, having a frequency of about 2 MHz), often referred to as a "bias source" in the field, allowing the ions and electrons to be projected onto the exposed surface of the substrate, the effect of which is to lightly etch (sputter) this surface. The first and second source are activated at powers that are typically between 1000 W and 10 000 W (for an apparatus intended to receive a substrate taking the form of a circular wafer of 300 mm in diameter). Precursor gases are introduced into the chamber so as to make them react with one another above the exposed surface of the substrate and gradually form the dielectric layer thereon. The chamber is kept at a very low pressure, on the order of an mTorr or a few tens of mTorr, using a suction pump to circulate the injected gases and the residual species from the reaction and extract them from the chamber. The chamber is also kept at a relatively low temperature, typically between 200° C. and 450° C. Thus, to form a layer of silicon oxide, a gas containing silicon, a gas containing oxygen and an inert gas (argon or helium, for example) are introduced into the chamber. By controlling the parameters of the chamber, and, in particular, the incoming gas flows and the source powers, it is possible to control the deposition effect and the sputtering effect that occur simultaneously over the course of the formation of the dielectric layer in the chamber, with a deposition/sputtering ratio of between 1 and 10, preferably between 2 and 5. This combined effect tends to compensate for the topology that may be present on the surface of the substrate and to form a particularly uniform and smooth layer. It is recalled in this regard that in order to obtain a surface that may be joined by molecular bonding, the surface must exhibit a roughness lower than 0.5 nm RMS (root mean square) over a field of measurement of 10 microns by 10 microns. Particularly surprisingly, in particular, for a relatively thick dielectric layer, thicker than 200 nm, such a formation process allows this requirement for low roughness to be met. Specifically, it is recalled that in the typical use of an HDP CVD apparatus, the layer formed aims to fill topological patterns that exhibit a substantial aspect ratio and that these depositions are necessarily followed by a polishing step. It was therefore in no way expected that the formation of the dielectric layer on the charge-trapping layer would lead to the formation of a layer exhibiting a surface roughness as low as 0.5 nm RMS over a field of measurement of 10 microns by 10 microns.

Returning to the process for preparing the carrier substrate 1, this process therefore comprises the formation of the dielectric layer 4 by implementing such a technique of simultaneous deposition and ion sputtering. In one favored implementation, the dielectric layer 4 consists of silicon oxide. In this case, and for a carrier substrate 1 with a size of 300 mm, the gases introduced into the chamber may comprise silane ($SiH_4$), oxygen and argon (or another inert gas such as helium), at mass flow rates of between 20 and 80 sccm (standard cubic centimeters per minute). The power of the sources may be chosen so as to be between 1000 W and 5000 W. The dielectric layer 4 is formed at a temperature of between 300° C. and 450° C., preferably between 350° C. and 400° C., and the pressure in the chamber is kept below atmospheric pressure, and preferably below 5 mTorr. These parameters may be controlled so as to define a deposition/sputtering ratio that is preferably between 2 and 5.

Of course, it is possible to choose to form a dielectric layer 4 other than a layer of silicon oxide, for example, a layer of silicon nitride or of silicon oxynitride, by modifying the nature of the gases introduced ($N_2$, $NH_3$ or $N_2O$ instead of the oxygen in this example) into the chamber and by adjusting the other parameters of the process.

In particular, it is possible to control the gas flows incoming into the chamber so as to form a dielectric layer 4 comprising at least one alternation formed of a first elementary layer of silicon oxide and a second elementary layer of silicon oxynitride or of silicon nitride. Thus, in one particular implementation, a layer of silicon oxynitride or nitride may be buried in the thickness of the dielectric layer mainly formed of silicon oxide. A barrier layer incorporated within the dielectric layer 4 is thus formed, this barrier making it possible, in particular, to limit, during the subsequent steps of producing the final substrate, the diffusion of certain species, such as hydrogen, through the depth of the dielectric layer. Advantageously, this barrier of silicon oxynitride or nitride is arranged close to the free face of the dielectric layer, for example, under a surface layer of 10 nm to 50 nm of silicon oxide.

In any case, and regardless of the exact nature of the dielectric layer 4, the deposition chamber will be kept in operation long enough to form a dielectric layer 4 of chosen thickness. In the context of the present description, this thickness is relatively thick, for example, thicker than 200 nm and advantageously between 200 nm and 1 micron or even 10 microns. By way of complementary example, it may be a question of forming a dielectric layer 4 with a thickness of 400 nm.

Tests performed by the applicant have shown that forming such a 400 nm layer of silicon oxide on a charge-trapping layer 2 of polycrystalline silicon taking the shape of a circular wafer with a diameter of 300 mm made it possible to prepare a carrier substrate 1 that has properties that are particularly suitable for the formation of the final substrate S.

Thus, and particularly unexpectedly as mentioned above, the exposed surface of this carrier substrate 1, i.e., the free surface of the dielectric layer 4 made of silicon oxide, exhibited a surface roughness lower than 2 Angstroms RMS (root mean square) over fields of measurement of 10 microns by 10 microns and over fields of measurement of 30 microns by 30 microns. This roughness is similar to that obtained by oxidizing a trapping layer made of polycrystalline silicon, after this layer has undergone a polishing step to rectify the roughness thereof. It is low enough to be compatible with a step of joining by molecular bonding. The proposed process for forming the dielectric layer 4 is thus highly advantageous in that it allows this polishing step to be omitted, thereby simplifying the process for preparing the carrier substrate 1.

In addition, the interface between the dielectric layer 4 of silicon oxide and the trapping layer of polycrystalline silicon exhibited a roughness lower than 2 Angstrom RMS (for the same fields of measurement of 10 microns by 10 microns and 30 microns by 30 microns) while a dielectric layer of silicon oxide with the same thickness of 400 nm formed by oxidizing the trapping layer of polycrystalline silicon exhibited a roughness on the order of 50 Angstrom RMS.

The process for forming the dielectric layer 4 is carried out at a relatively low temperature, lower than 400° C., and around 380° C. to form a dielectric layer of silicon oxide. Recrystallization of the charge-trapping layer 2 and loss of the electric traps is thus avoided, this potentially occurring when this layer is exposed to higher temperatures, via solid-phase re-epitaxy of this layer.

In addition, the formation of the dielectric layer 4 according to the proposed technique causes significantly less deformation of the carrier substrate 1 (on the order of 100 microns on a carrier substrate 1 of 300 mm provided with a layer of silicon oxide of 400 nm) than that caused by oxidizing a trapping layer of polycrystalline silicon (on the order of 150 microns). Again, this property makes a carrier substrate 1 obtained by means of a process according to the disclosure much more compatible with a step of joining by molecular bonding. This property is improved further when the carrier substrate is provided with a compensation layer, the thickness of this layer being able to be chosen so as to compensate exactly for the deformation brought about by the dielectric layer 4 and, to a lesser degree, by the charge-trapping layer. This embodiment is particularly useful when the dielectric layer exhibits a substantial thickness, thicker than 600 nm.

It should be noted that the process for preparing the carrier substrate 1 may also incorporate a step of annealing the dielectric layer 4. This anneal, referred to as a degassing or densifying anneal, is advantageously performed in a neutral atmosphere. It is performed at a temperature higher than the temperature of deposition of the dielectric layer 4, and preferably lower than 950° C., for a relatively short time, shorter than 1 h, for example, 30 minutes. The time and temperature of this anneal will be chosen so as to avoid, or at least limit, recrystallization of the charge-trapping layer 2. This annealing step may affect the curvature of the carrier substrate, and it will be taken into account in determining the thickness of the compensation layer.

Production of the Final Substrate

On completion of the preparation process presented above, what is obtained is a carrier substrate 1 having at least one charge-trapping layer 2 and one dielectric layer 4 arranged in succession on the base substrate 3. The carrier substrate may also include a bow compensation layer 32 that allows the curvature of this substrate to be kept lower than or equal to 100 microns, for example, between 100 and 60 microns, even in the presence of a thick dielectric layer, for example, of 600 nm.

As mentioned above, the carrier substrate 1 is intended to receive, by transfer, a thin layer 5 and thus form a final substrate S. The carrier substrate 1 exhibits properties that are suitable (in terms of surface roughness and deformation, in particular) for receiving such a thin layer 5.

As is well known per se, this transfer is usually achieved by joining a free face of a donor substrate to the carrier substrate 1, preferably by molecular bonding. Since the dielectric layer 4 has already been formed on the carrier substrate 1, it is not necessary for the donor substrate itself to be provided with such a dielectric layer. Nonetheless, this donor substrate may be provided with a thin layer of dielectric (for example, thinner than 150 nm), but in any case this thickness will always be much lower than the thickness of the dielectric layer 4 of the final structure S, since a portion of this thickness will be provided by the dielectric layer 4 formed on the carrier substrate 1. The donor substrate is therefore preferably devoid of any intentionally formed dielectric surface layer. The nature of the donor substrate is chosen according to the desired nature of the thin layer 5, as already described in a previous section of this description. It may therefore be a substrate formed of a monocrystalline semiconductor, for example, silicon, or a substrate formed of a piezoelectric material or comprising a surface layer of such a piezoelectric material.

After this joining step, the thickness of the donor substrate is reduced to form the thin layer 5. This reduction step may be performed by means of mechanical or chemical thinning, but in the context of the present description and to best take advantage of the advantageous properties of the carrier substrate 1, the thickness of the donor substrate is reduced by splitting at a weakened plane introduced previously, for example, according to the principles of the SMART CUT® technology, as explained in the introduction to this application. This weakened plane defines, with the free surface of the donor substrate, the thin layer 5.

It should be noted that since the donor substrate preferably does not have a surface dielectric layer (or has a layer of relatively low thickness), the dose and energy of the species implanted to form the weakened plane may be kept at reasonable values, even when the final substrate S exhibits a thick dielectric layer 4, of 200 nm or more.

Transferring the thin layer does not change the balance of stresses, such that at this stage the final substrate exhibits a curvature that is very similar to that of the carrier substrate.

After this thinning, or preferably splitting, step, steps for finishing the thin layer 5, such as a polishing step, a heat treatment under a reducing or inert atmosphere, and a sacrificial oxidation may be carried out after the thickness reduction step.

When the donor substrate is just a substrate, i.e., comprises no integrated devices, an "on-insulator" final substrate S is thus formed in which the thin layer 5 is a layer of virgin material comprising the carrier substrate 1 according to the present disclosure. This final substrate S may then be used to form integrated or photonic devices, as illustrated in FIG. 4. When the donor substrate has been processed beforehand to form integrated devices on its surface, a thin layer 5 that comprises these devices is obtained at the end of this process.

Of course, the invention is not limited to the described implementations and modifications may be made thereto without departing from the scope of the invention as defined by the claims.

The invention claimed is:

1. A method of transferring a thin layer to a carrier substrate, comprising:
    preparing a carrier substrate using a preparation process comprising providing a base substrate that has, on a main face, a charge-trapping layer and forming a dielectric layer having a thickness greater than 200 nm on the charge-trapping layer, the forming of the dielectric layer simultaneously implementing chemical vapor deposition and ion sputtering of the dielectric layer;
    joining, by molecular bonding and without preparing a free face of the dielectric layer by polishing, a donor substrate to the dielectric layer of the carrier substrate, the donor substrate including a weakened plane defining the thin layer; and
    splitting the donor substrate at the weakened plane so as to release the thin layer and transfer it to the carrier substrate.

2. The method of claim 1, wherein the preparation process further comprises forming a bow compensation layer on a back face of the base substrate, the back face on a side of the base substrate opposite the main face.

3. The method of claim 2, wherein the bow compensation layer has a thickness of between 500 nm and 1000 nm.

4. The method of claim 1, wherein the base substrate is a monocrystalline silicon substrate exhibiting a resistivity higher than 600 ohm·cm.

5. The method of claim 1, wherein the charge-trapping layer comprises polycrystalline silicon.

6. The method of claim 1, wherein the charge-trapping layer comprises carbon.

7. The method of claim 1, wherein the charge-trapping layer has a thickness of between 1 micron and 20 microns.

8. The method of claim 1, wherein the dielectric layer consists of silicon oxide.

9. The method of claim 1, wherein the dielectric layer comprises a barrier layer made of silicon nitride or of silicon oxynitride.

10. The method of claim 1, wherein the dielectric layer has a thickness of between 200 nm and 10 microns.

11. The method of claim 10, wherein the dielectric layer has a thickness of between 600 nm and 10 microns.

12. The method of claim 1, wherein a deposition/sputtering ratio is between 1 and 10.

13. The method of claim 12, wherein a deposition/sputtering ratio is between 2 and 5.

14. The method of claim 1, wherein the dielectric layer is formed at a temperature of between 300° C. and 450° C., preferably between 350° C. and 400° C.

15. The method of claim 14, wherein the dielectric layer is formed at a temperature of between 350° C. and 400° C.

16. The method of claim 1, wherein the dielectric layer is formed in an atmosphere exhibiting a pressure lower than atmospheric pressure.

17. The method of claim 1, further comprising an operation of annealing the dielectric layer in a neutral atmosphere and at a temperature exceeding the temperature of formation of the dielectric layer.

18. The method of claim 17, wherein the operation of annealing the dielectric layer in the neutral atmosphere is performed at a temperature lower than 950° C.

19. The method of claim 1, wherein the free face of the dielectric layer exhibits a roughness lower than 0.5 nm in terms of RMS value over a field of measurement of 10 microns by 10 microns.

20. The method of claim 1, wherein the donor substrate is devoid of any dielectric surface layer.

* * * * *